United States Patent
Ju (10) Patent No.: US 9,202,829 B2
(45) Date of Patent: Dec. 1, 2015

(54) LIGHT SENSORS WITH INFRARED PHOTOCURRENT SUPPRESSION

(71) Applicant: Donghyuk Ju, Cupertino, CA (US)

(72) Inventor: Donghyuk Ju, Cupertino, CA (US)

( * ) Notice: Subject to any disclaimer, the term of this patent is extended or adjusted under 35 U.S.C. 154(b) by 177 days.

(21) Appl. No.: 13/910,010

(22) Filed: Jun. 4, 2013

(65) Prior Publication Data

US 2014/0353792 A1    Dec. 4, 2014

(51) Int. Cl.
*H01L 27/144*   (2006.01)
*H01L 31/00*    (2006.01)

(52) U.S. Cl.
CPC .......... *H01L 27/1446* (2013.01); *H01L 31/00* (2013.01)

(58) Field of Classification Search
CPC . H01L 31/103; H01L 31/113; H01L 31/0216; H01L 31/02966; H01L 31/035236; H01L 31/09; H01L 31/101; H01L 31/1032; H01L 31/11; H01L 31/1133; H01L 31/1832
USPC ........................................................ 257/466
See application file for complete search history.

(56) References Cited

U.S. PATENT DOCUMENTS

| | | | |
|---|---|---|---|
| 6,596,981 B1 | 7/2003 | Aswell et al. | |
| 7,446,303 B2 | 11/2008 | Maniam et al. | |
| 7,554,073 B2 | 6/2009 | Lum et al. | |
| 7,755,117 B2 | 7/2010 | Kalnitsky et al. | |
| 7,960,766 B2 | 6/2011 | Kalnitsky et al. | |
| 7,960,807 B2 | 6/2011 | Lin et al. | |
| 8,269,172 B2 | 9/2012 | Skurnik | |
| 8,274,051 B1 | 9/2012 | Aswell et al. | |
| 8,309,994 B2 | 11/2012 | Kalnitsky et al. | |
| 2007/0131987 A1* | 6/2007 | Kim | 257/290 |
| 2013/0062604 A1* | 3/2013 | Kautzsch | 257/48 |

* cited by examiner

*Primary Examiner* — Peniel M Gumedzoe
*Assistant Examiner* — Christopher Johnson (57) ABSTRACT

A light sensor is formed by an array of photodiodes comprising a plurality of regions of a first conductivity type that have been formed in a semiconductor layer or a substrate of a second conductivity type, and deep trenches placed between regions of the first conductivity type. Trenches extend deep into the substrate and have a high density of interface traps at the trench-silicon interface. A large portion of photocarriers generated by infrared recombines at the trench-silicon interface, and as a result, the spectral sensitivity of the light sensor is diminished in the infrared spectrum.

8 Claims, 10 Drawing Sheets

LIGHT SENSORS WITH INFRARED PHOTOCURRENT SUPPRESSION

CROSS-REFERENCE TO RELATED APPLICATIONS

This application claims the benefit of prior filed U.S. provisional patent application No. 61/759,341, filed on Jan. 31, 2013, entitled "Photodiodes with Improved Spectral Response and Methods of Manufacturing the Same" under 35 USC §119(e).

FIELD OF THE INVENTION

The present invention relates generally to semiconductor devices, and more particularly, to silicon light sensors for ambient light sensing.

BACKGROUND OF THE INVENTION

Ambient light sensors (ALS) are widely used in many applications, for example, in mobile electronic devices such as cell phones and portable computers. Ambient light sensors allow display brightness to be automatically adjusted based on the light intensity in the environment. As a result, battery power consumed by the display is optimally managed and the user's viewing comfort is improved. One skilled in the art will recognize that there are many other applications for ambient light sensors.

A common type of light detecting devices used in the ambient light sensor is the silicon photodiode. Its simple structure renders silicon photodiode easy-to-use and a low-cost solution readily available from today's mainstream semiconductor manufacturing technologies such as complementary metal-oxide-semiconductor (CMOS) technology. CMOS technology allows silicon photodiode to be easily integrated on a same chip with analog and digital circuits required to perform the light sensing and control functions.

Figure 1:
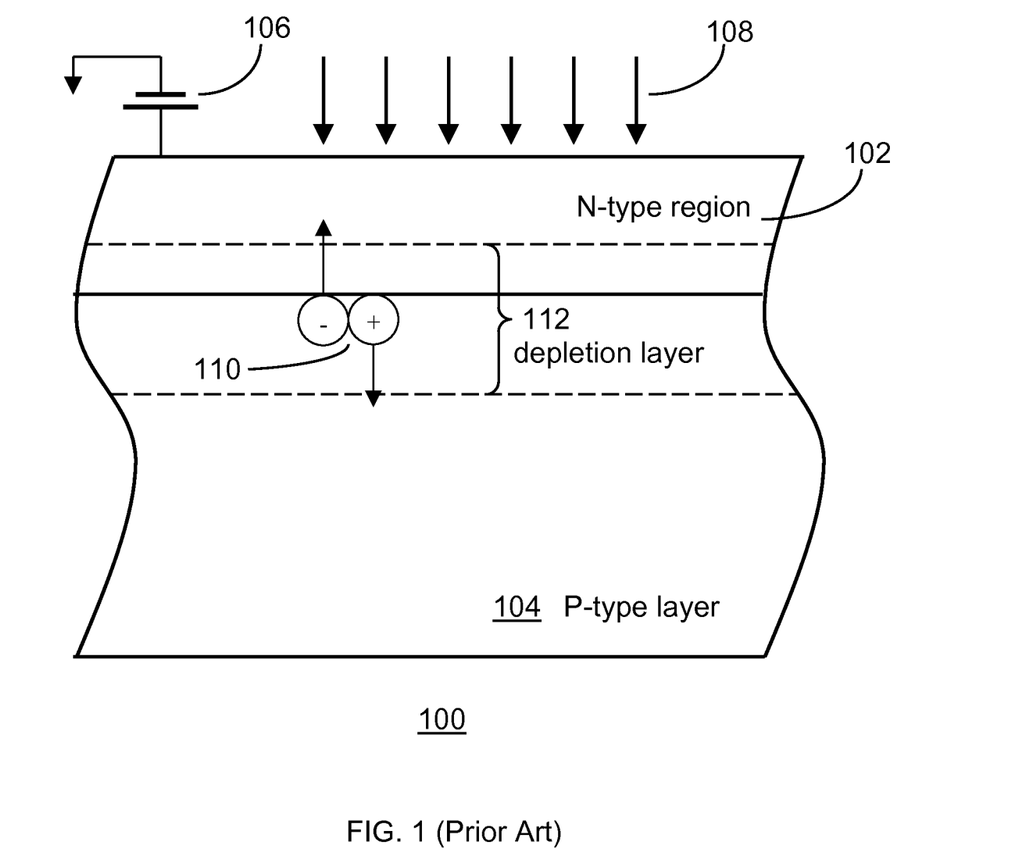
FIG. 1 is a cross-sectional view of a photodiode known in the prior art.

FIG. 1 illustrates the basic structure of an exemplary photodiode 100, where an N-type region 102 is shown inside a P-type layer (e.g., P-well, P-type substrate or P-type epitaxial layer) 104. The N-type region (e.g., N+ or N-well) is more heavily doped than the P-type layer and forms a PN junction with the P-type layer. To perform the light detecting function, PN junction is reverse-biased with a DC power supply 106.

Referring to FIG. 1, when light 108 is incident on a photodiode, electron-hole pairs 110 (also referred to as photocarriers, or carriers) are generated as a result of light absorption in silicon. Once generated, electrons and holes move toward cathode (N-type region) and anode (P-type layer), respectively. Carriers that do not recombine in silicon, for example, most of the carriers generated within and in the vicinity of the depletion layer 112 of the photodiode PN junction, flow out of the cathode and anode terminals and produce the photocurrent. This photocurrent is indicative of the intensity of the incident light 108.

Figure 2:
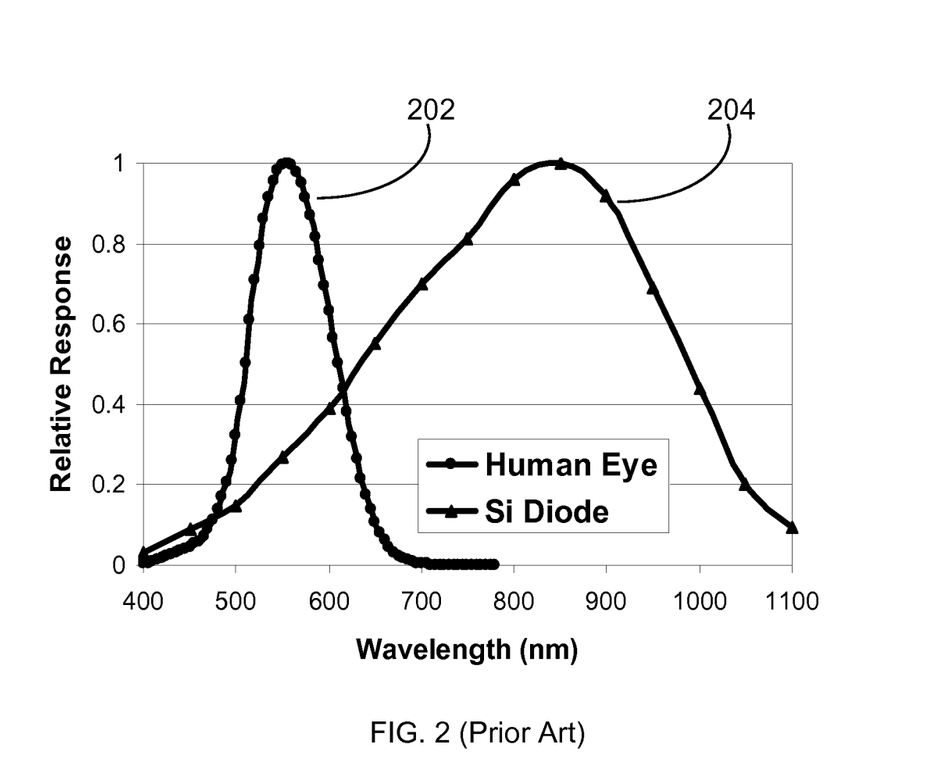
FIG. 2 is a graphical plot for the spectral responses for the human eye, known as CIE photopic curve, and for an exemplary silicon photodiode found in the prior art.

While the silicon photodiode has a number of aforementioned benefits, a major problem is that its spectral response does not match that of the human eye. FIG. 2 shows the spectral response of the human eye 202, commonly known as the CIE photopic curve, and a spectral response 204 of an exemplary silicon photodiode. The human eye detects light in a narrow range of wavelengths, between 400 nanometers (nm) and 700 nm, in which the eye sensitivity peaks at around 550 nm. Notice in FIG. 2 that the spectral response of the exemplary silicon photodiode is much broader than that of the human eye, extending beyond 700 nm well into the infrared range. Because of this mismatch, the light intensity as detected by a silicon photodiode and as perceived by the human eye can differ significantly. The mismatch can be especially problematic for the light sources that emit a large amount of infrared such as incandescent lamps and the sun. The presence of an infrared source, such as a heater, near a silicon photodiode also interferes with and disrupt light sensing ability of the silicon photodiode.

Figure 3:
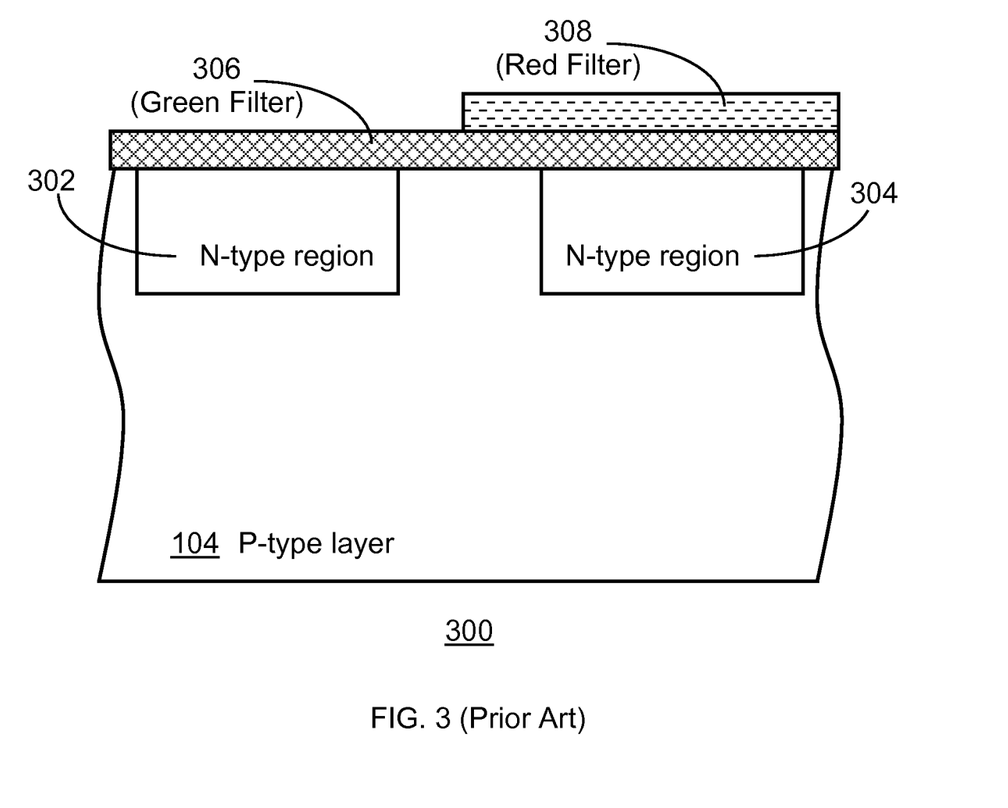
FIG. 3 is a cross-sectional view of an exemplary light sensor found in the prior art where a combination of two photodiodes covered with optical filters is used to circumvent infrared sensitivity of silicon photodiode.

To circumvent problems associated with the infrared sensitivity of silicon photodiode, conventional silicon light sensors employ multiple photodiodes and optical filters. FIG. 3 shows one such exemplary light sensor 300 found within the prior art, in this example, using two photodiodes, 302 and 304 and optical filters 306 and 308. The first photodiode 302 is covered with a green filter 306. Optical filters commonly used in light sensors are organic filters and do not cut off infrared. As such, visible light and a portion of infrared light pass through the green filter 306 and enter the first photodiode 302. The second photodiode 304 is covered with a green filter 306 and a red filter 308. As a result, the visible light is filtered out and only a portion of the infrared light enters the second photodiode 304. The photocurrent measured from the first photodiode 302 is indicative of the intensity of the visible light and a portion of infrared. The photocurrent measured from the second photodiode 304 is indicative of the intensity of a portion of infrared. By subtracting the photocurrent of the second photodiode from that of the first and applying a weighting factor between the two photocurrents, infrared component in the first photocurrent is eliminated and the resultant photocurrent represents the intensity of the visible light. One skilled in the art will recognize that there can be other ways to produce such an information regarding visible light intensity using multiple photodiodes and optical filters.

In conventional ambient light sensors found within the prior art, the need to accommodate multiple photodiodes in a light sensor increases die size, which in turn increases the die cost. Use of optical filters increases manufacturing cost and can be a reliability concern during operation at high temperatures or under long exposure to ultraviolet irradiation. Subtraction of one large infrared photocurrent from another can introduce large errors and lead to inaccurate results. What is desired is an ambient light sensor in which the photocurrent generation by infrared is suppressed so that the shortcomings of the conventional light sensors are mitigated.

BRIEF SUMMARY OF THE INVENTION

Light sensors are disclosed of which the spectral sensitivity is suppressed in the infrared spectrum. According to one embodiment of the present invention, deep trenches are formed spaced at a certain interval into a semiconductor substrate of a first conductivity type. Trench-silicon interface is covered with a thin dielectric liner and the trench gap is filled with a gap-filling material such as silicon dioxide ($SiO_2$), polysilicon or air. Regions of a second conductivity type, positioned between the trenches, form photodiodes with the layer of a first conductivity type. The interface traps (also referred to as interface states) present at the trench-silicon interface (or interface between the trench liner dielectric and silicon, to be precise) act as recombination centers through which minority carriers recombine with majority carriers and disappear without contributing to photocurrent. The visible light creates photocarriers mostly within or in the vicinity of the photodiode depletion layer. These carriers are swept out of the photodiodes without much recombination and produce a photocurrent that is indicative of the intensity of the visible light. Photocarrier generation by infrared takes place deeper in the silicon substrate. Trenches are sufficiently deep so that the minority carriers generated by infrared have a much higher probability of reaching trench-silicon interfaces than reaching the photodiode depletion layers. At the trench-silicon interface, minority carriers disappear through recombination aided by interface traps. As a result, a large portion of infrared-generated photocarriers is removed from the device and the suppression of photocurrent in the infrared spectrum is accomplished. Further details of the above-summarized light sensors, as well as details of other embodiments of the light sensors, are described below with respect to the accompanying drawings.

DETAILED DESCRIPTION OF THE INVENTION

Figure 4:
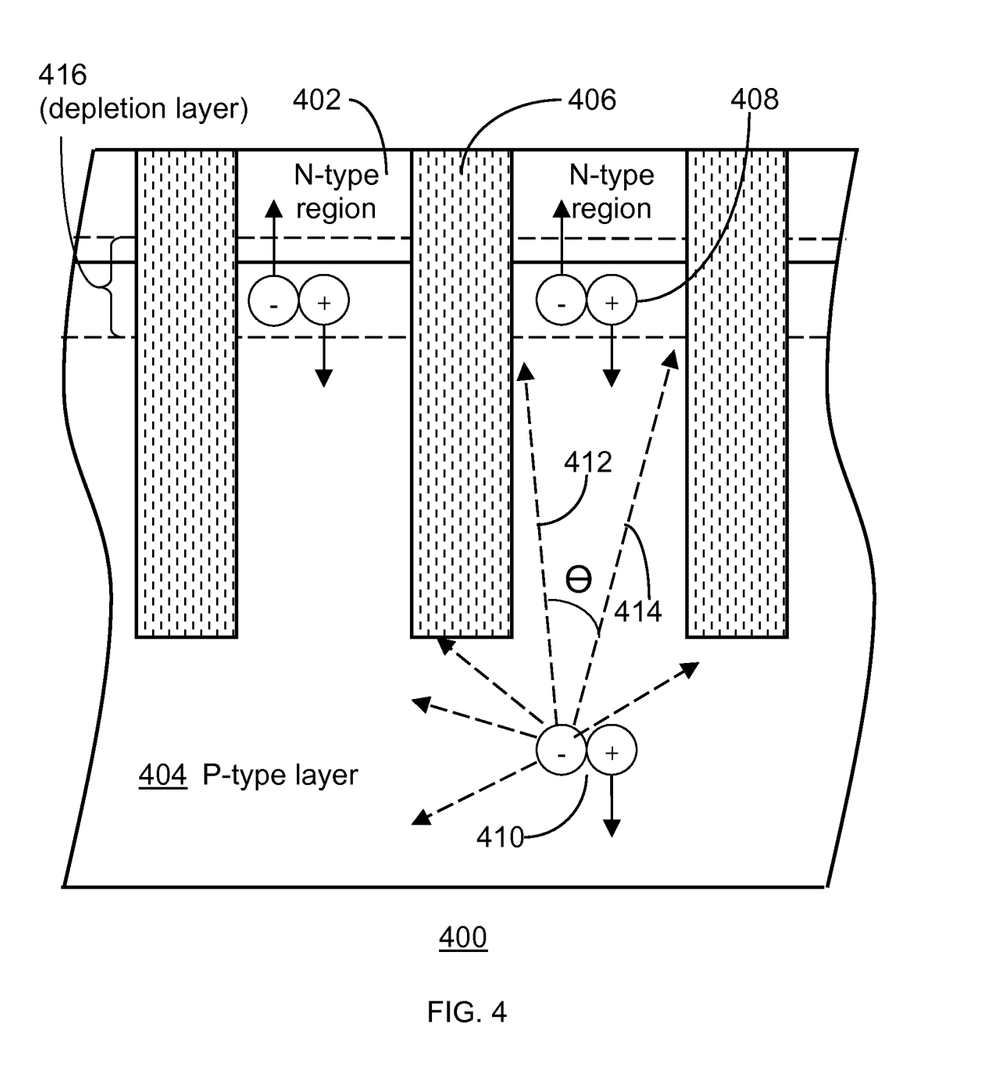
FIG. 4 is a cross-sectional view of a light sensor according to one embodiment of the present invention.

Referring to FIG. 4 there is shown a cross-sectional drawing of a light sensor 400, according to one embodiment of the present invention. The light sensor 400 comprises an array of photodiodes and trenches. Each photodiode comprises a N-type region 402 formed in a P-type layer 404. The N-type region may be a heavily doped N+ region, or N-well which has a lower doping and a larger junction depth than N+. A typical junction depth of the N-type region ranges from one micrometer (μm) to 3 μm but it can be as shallow as 0.5 μm. The P-type layer may be a P-type substrate or a P-type epitaxial layer formed on a P-type substrate, or a P-type well, which itself is formed in a P-type epitaxial layer or P-type substrate. The trenches 406 are shown positioned at an equal interval but the interval may vary. Trenches are formed sufficiently deep into the silicon substrate so that the trench-silicon interface can capture a large quantity of minority carriers created by infrared. The trench depth typically ranges from 5 μm to 20 μm but it can be larger. For illustration purposes, trenches 406 in FIG. 4 are shown filled with silicon dioxide ($SiO_2$) liner and also with $SiO_2$ as a gap-fill material. One skilled in the art will recognize that other material can be used as a trench liner and gap-fill material. For example, silicon nitride ($Si_3N_4$) may be used as a liner and gap-fill material. In another example, poly crystalline silicon (or polysilicon) may be used as a gap-fill material with $SiO_2$ as a trench liner. In yet another example, $SiO_2$ liner may be used while the trench gap is filled with air, i.e., left unfilled. Although the trenches 406 in FIG. 4 are shown to abut the N-type regions for the sake of illustration, trenches and N-type regions may be separated. The individual N-type regions are connected together by a metal interconnect (not shown), e.g., aluminum or copper, forming the cathode, while the P-type layer becomes the anode. Although the presentation in reference to FIG. 4 has been made using N-type regions and a P-type layer, one skilled in the art will recognize that the use of opposite conductivity types for the photodiode, i.e., P-type regions in an N-type layer, will work equally well.

It should be noted that reference herein to "light sensor" means a collection of device components, e.g., PN junctions and trenches, which together perform the light detecting function in a desired way. It should also be noted that the term "photodiode" herein refers specifically to a PN junction or a set of PN junctions that perform the basic function of light detection.

It should be further noted that the dimensions, horizontal and vertical, of the various parts of the light sensor 400 in FIG. 4 and other drawings of this disclosure, including the thicknesses of its various layers, depth and lateral reach of its doped regions are not necessarily drawn to scale. In some cases, layer thicknesses, junction depths, lengths and widths and other dimensions are exaggerated so as to best illustrate the structural features and/or functional aspects of the present invention.

When light enters silicon, its intensity drops exponentially with distance as light is absorbed by silicon. The rate of light absorption in silicon, characterized by a parameter called "absorption coefficient", is a strong function of wavelengths; the shorter the wavelength, higher the absorption rate. Thus light with short wavelengths, such as ultraviolet (UV) and blue light, is absorbed mostly near the silicon surface, whereas absorption of longer-wavelength light, such as infrared, takes place deeper in silicon over a longer distance. A fifty percent of a blue light with a wavelength of 400 nm, when incident vertically, is absorbed within the depth of 0.073 μm from the surface, and 90% of the incident blue light is absorbed within the distance of 0.24 μm from the surface. At an infrared wavelength of 900 nm, 50% of the incident light is absorbed within 23 μm from the surface and 90% is absorbed within 75 μm from the surface.

Referring back to FIG. 1, in a typical photodiode used to detect the ambient light, most of the visible light is absorbed in the surface diffusion region, e.g., N-type region 102 in FIG. 1, and also inside and near the depletion layer surrounding the photodiode junction. This means electron-hole pairs are generated by the visible light mostly in the surface diffusion region and inside and in the vicinity of the depletion layer. Upon generation, most of these photocarriers drift to the cathode and anode terminals without experiencing recombination. As a result, these carriers produce a photocurrent that represents the intensity of the visible light. Photocarriers generated deep in the substrate, such as those generated by infrared, begin moving around in the silicon crystalline lattice by diffusion. During diffusion, some of the minority carriers (e.g., electrons in FIG. 1) encounter majority carriers, and recombine and disappear. The average distance a minority carrier travels before it disappears by recombination is referred to as the diffusion length. It is a function of the impurity doping concentration, and density of defects and crystalline imperfections in silicon. The diffusion length of electron can be greater than one hundred micrometers for a P-type substrate with a doping concentration of $1\times10^{15}/cm^3$ to $1\times10^{16}/cm^3$. Therefore, in conventional photodiodes depicted in FIG. 1, many photocarriers generated deep in the silicon substrate by infrared have a high probability to get to the photodiode junction without experiencing recombination. Upon arriving at the photodiode junction, these minority carriers are swept out of the photodiode by the electric field inside the depletion layer and produce a photocurrent that is indicative of the intensity of infrared. This is one of the main reasons silicon photodiodes have a high sensitivity to infrared.

Trenches formed in silicon substrate have been used in CMOS technology for several useful purposes. Shallow trenches, typically with a depth of ~0.4 μm, are widely used to electrically isolate semiconductor devices, such as transistors, diodes and resistors on an integrated-circuit chip. Deep trenches with a depth of 10 μm or more, are used to isolate devices that require high operating voltages, e.g., 20 volts (V) to 100V, and also to suppress undesirable parasitic effects such as latch-up. Deep trench is also an important feature of certain dynamic random access memory (DRAM) technologies where it is used to build memory bit cell capacitors.

Trenches are formed by etching deep holes or grooves into the silicon substrate followed by a deposition of a thin dielectric liner along the trench walls at its side and bottom, and a gap-fill process. The trench gap may be filled with dielectric material or polysilicon but it may be left unfilled, in which case, the trench has an air-gap. It is known that there exists a large amount of interface traps (or alternatively, surface states or interface states) at a semiconductor surface where the crystalline structure is abruptly terminated, such as trench walls. The interface traps act as recombination centers through which carriers recombine easily, i.e., at a much higher recombination rate than inside the crystalline silicon lattice. A typical value of the interface trap density at the silicon surface covered with a high quality $SiO_2$ film ranges from $1\times10^{10}$/eV-cm$^2$ to $1\times10^{11}$/eV-cm$^2$, where eV is an energy unit of electron-volt. Defects introduced in the silicon wafer and damages created on the silicon surface during manufacturing process can significantly increase the interface trap density. Therefore, the interface trap density depends strongly on wafer processing conditions of certain processing steps such as trench etch, film deposition, implant and anneal. By tuning these process conditions, the interface trap density can be increased so that the carrier recombination at the trench-silicon interface is enhanced significantly. The present invention makes use of high recombination rates at the deep trench interfaces so that the photocarriers created by infrared are removed by recombination at the trench-silicon interface, thereby preventing them from contributing to the photocurrent.

Returning to FIG. 4, most photocarriers generated within the N-type region 402 and the depletion layer 416, represented by an electron-hole pair 408, flow out of the photodiode and contribute to photocurrent. For the photocarriers generated below the N-type region, represented by an electron-hole pair 410, there are three possibilities for the fate of the minority carriers (electrons in the P-type layer); to reach the photodiode junction and be collected by the photodiode as a photocurrent, or to reach the trench-silicon interface and disappear via recombination, or to diffuse into the P-type layer and disappear via recombination with majority carriers (holes in the P-type layer) in the silicon lattice. The probability of a minority carrier to be collected by a photodiode junction is, to a first order approximation, proportional to the solid angle "theta" defined by the two trajectory lines 412 and 414. For a fixed N-type region width, the angle becomes smaller as the distance from the photodiode junction to the point of carrier generation increases, and as a result, the probability of minority carriers to be collected by the photodiode decreases. For a sufficiently large vertical distance below the junction and for a small N-type region width, it is highly probable that the amount of carriers collected by the photodiode becomes quite small and conversely, the amount of carriers reaching the trench-silicon interface becomes significant. Since the recombination rate is high at the trench-silicon interface, it follows that a large amount of carriers generated deep in the substrate, such as those generated by infrared, recombines at the trench-silicon interface and disappear without producing photocurrents. Removal of infrared-generated carriers thus depends on several key parameters; trench depth, interface trap density at the trench-silicon interface and width of N-type region.

Figure 5:
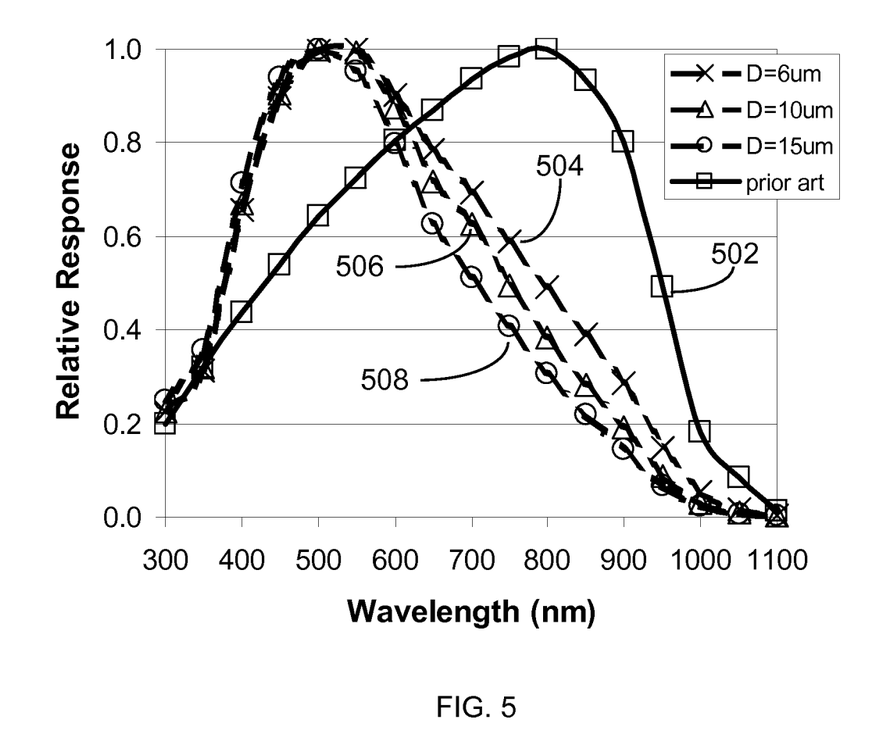
FIG. 5 is a graphical plot of computer-simulated spectral responses obtained from the present invention.

FIG. 5 illustrates the effect of trench depth on the spectral response of an exemplary light sensor according to one embodiment of the present invention depicted in FIG. 4. Graph 502 in FIG. 5 is a computer-simulated spectral response of a conventional light sensor without trenches from the prior art. Graphs 504, 506 and 508 are simulated spectral response curves for light sensors according to the present invention shown in FIG. 4 with trench depths of 6 μm, 10 μm and 15 μm, respectively. The effectiveness of deep trench and the effect of trench depth on removing the infrared-generated photocarriers are evident in FIG. 5.

Figure 6:
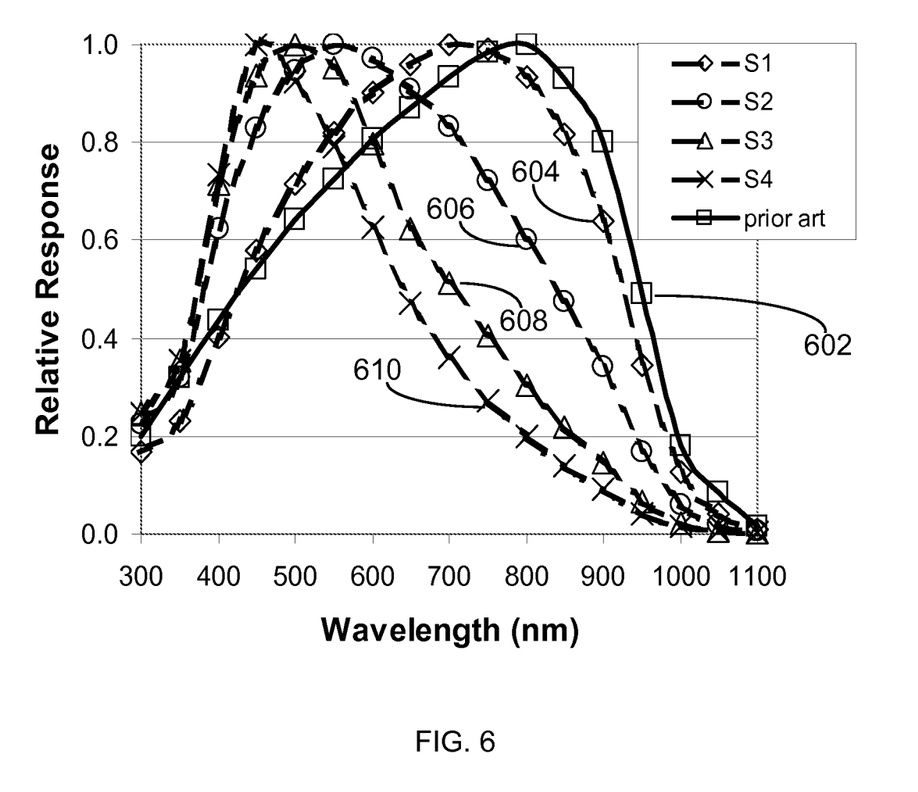
FIG. 6 is another graphical plot of computer-simulated spectral responses obtained from the present invention.

FIG. 6 is an another set of graphs of computer-simulated spectral response of an exemplary light sensor according to one embodiment of the present invention illustrated in FIG. 4. Graph 602, same as 502, is a spectral response of a conventional light sensor without trenches, inserted herein again as a reference. Graphs 604, 606, 608 and 610 are the simulated spectral responses of a light sensor according to the present invention for different values of interface trap density at the trench-silicon interface. The carrier recombination rate (i.e., the speed of carrier recombination) at the semiconductor surface or interface is characterized by a parameter called "surface recombination velocity" S, which has a unit of centimeters per second (cm/sec). Surface recombination velocity is directly proportional to the interface trap density. Graphs 604, 606, 608 and 610 are obtained from simulations with a fixed trench depth but with different values of surface recombination velocity, S1, S2, S3 and S4, respectively, with S1<S2<S3<S4. Graphs in FIG. 6 illustrate that the spectral sensitivity in the infrared spectrum according to the present invention diminishes significantly as surface recombination velocity at the trench-silicon interface increases. Stated another way, infrared sensitivity of a light sensor according to the present invention is significantly reduced with increasing interface trap density at the trench-silicon interface.

Figure 7:
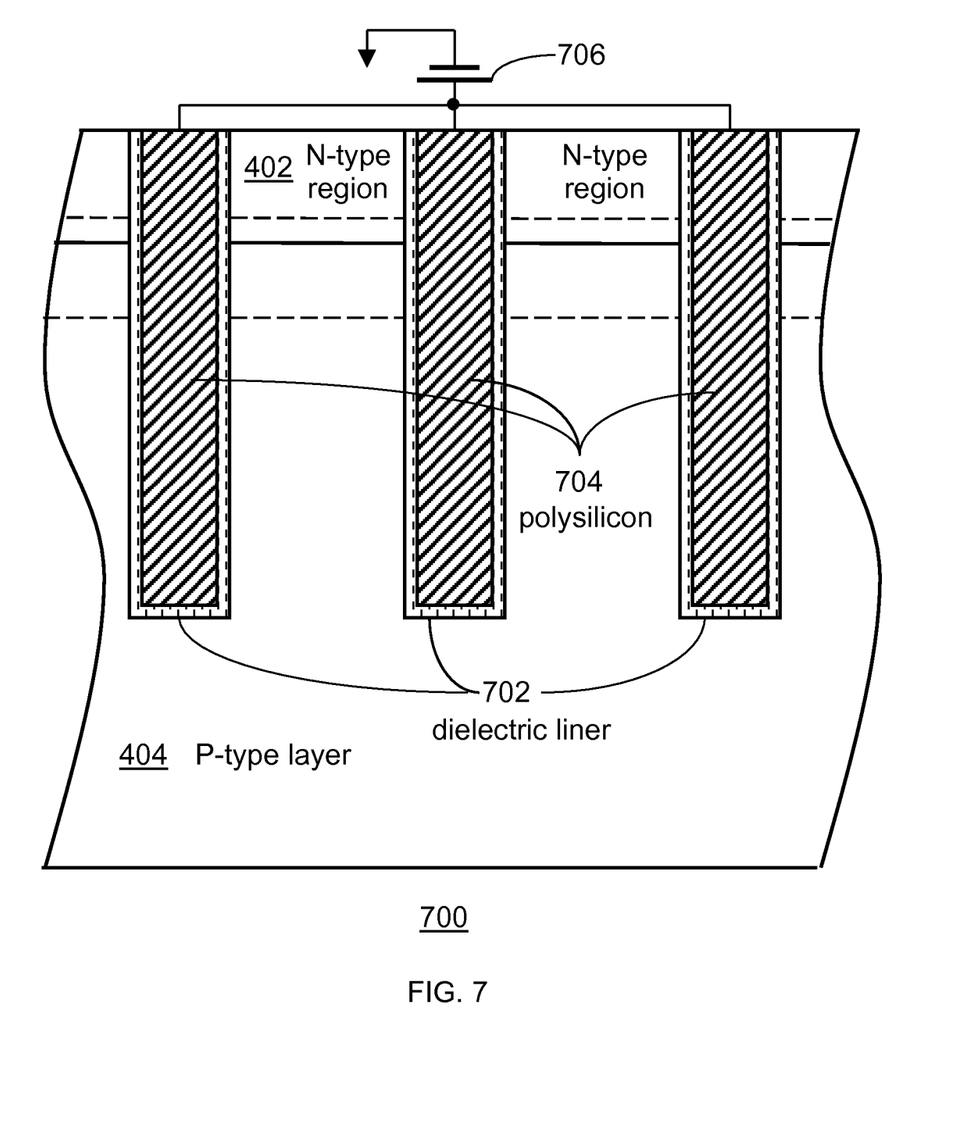
FIG. 7 is a cross-sectional view of a light sensor according to another embodiment of the present invention.

FIG. 7 shows a cross-sectional drawing of a light sensor 700 according to another embodiment of the present invention. The light sensor 700 comprises an array of photodiodes formed by N-type regions 402 separated by deep trenches and P-type layer 404. In contrast to trenches in FIG. 4, wherein the trenches are filled with a thin dielectric liner and a dielectric gap-fill material, trenches in FIG. 7 are filled with a thin dielectric liner 702, e.g., $SiO_2$, and polysilicon 704. The light sensor 700 is otherwise the same as the light sensor 400 of FIG. 4 and the descriptions in regards to N-type regions 402 and P-type layer 404 in reference to FIG. 4 also apply to light sensor 700. Polysilicon that fills the trench can be an undoped polysilicon or a doped polysilicon. Having a heavily doped polysilicon in a trench is advantageous since it allows a DC bias voltage 706 to be applied to the polysilicon. The voltage applied to the polysilicon in the trench creates an electric field in the P-type layer such that it aids the movement of the minority carriers toward the trench-silicon interface, resulting in the enhancement of carrier recombination.

Figure 8:
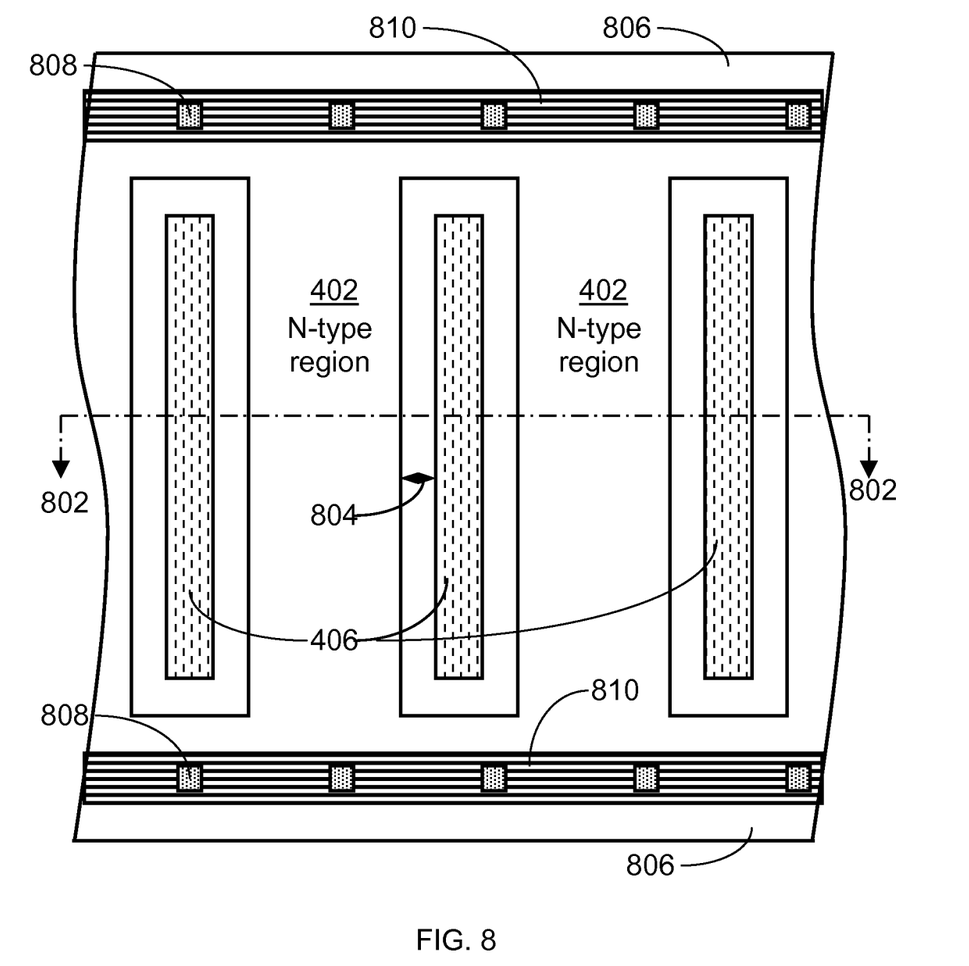
FIG. 8 is a top view of a light sensor according to one embodiment of the present invention.

FIG. 8 is a top view of an embodiment of the present invention of which the cross-sectional drawing, when cut along the line 802, is shown in FIG. 4. An N-type region 402 forms a photodiode with P-type layer vertically underneath and has a shape of a narrow and long stripe. The width and length of individual N-type stripes may be constant or vary across the photodiode array. Trenches are placed between individual N-type stripes, separated from the edge of an N-type region by a distance 804. The trench separation distance 804 from the N-type region can be as small as zero, which is the case shown in FIG. 4. The N-type stripes are connected to a common N-type region 806 at one end or at both ends of the N-type stripe array. Contact holes 808 are formed in the common N-type regions 806. Metal interconnects 810 laid down over the contacts connect all N-type stripes.

Figure 9:
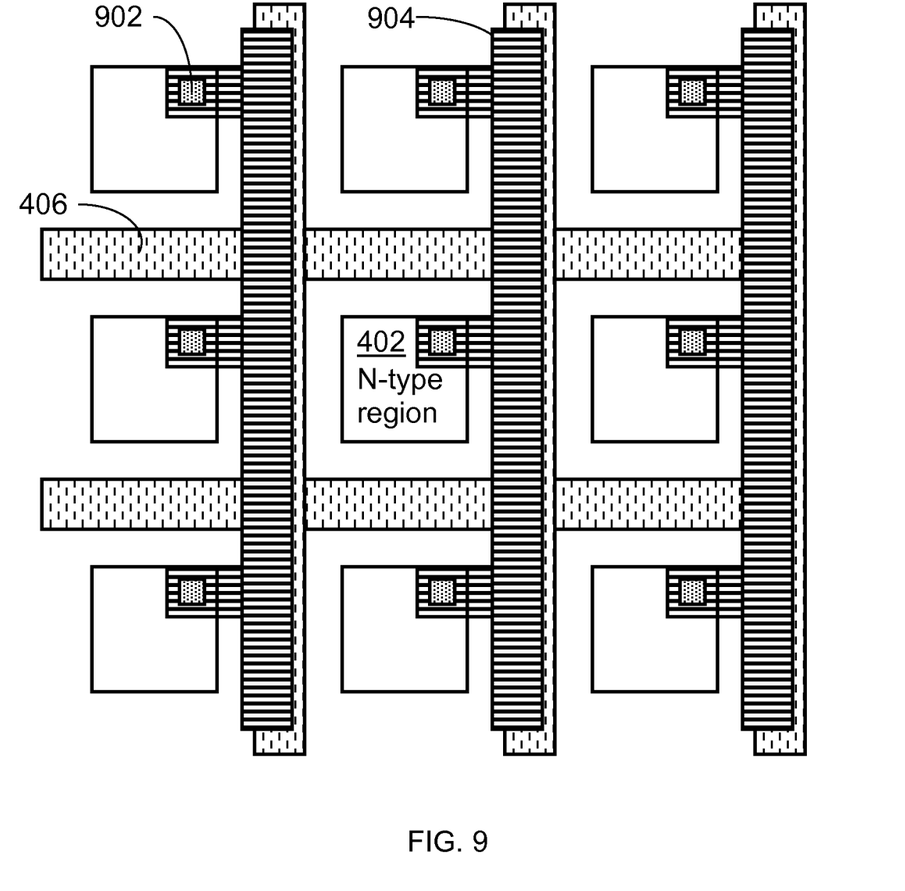
FIG. 9 is a top view of a light sensor according to another embodiment of the present invention.

FIG. 9 is an another example of a top view of an embodiment of the present invention. In FIG. 9, N-type regions 402 are laid out in isolated blocks. Each N-type block is surrounded by trenches 406 which are laid out as a grid. Contacts 902 are formed in each N-type block and are connected to metal interconnects 904. Since each N-type block is surrounded by trenches on four sides, carrier recombination at the trench-silicon interface increases and the infrared sensitivity of the light sensor in FIG. 9 is suppressed more effectively than in FIG. 8.

Figure 10:
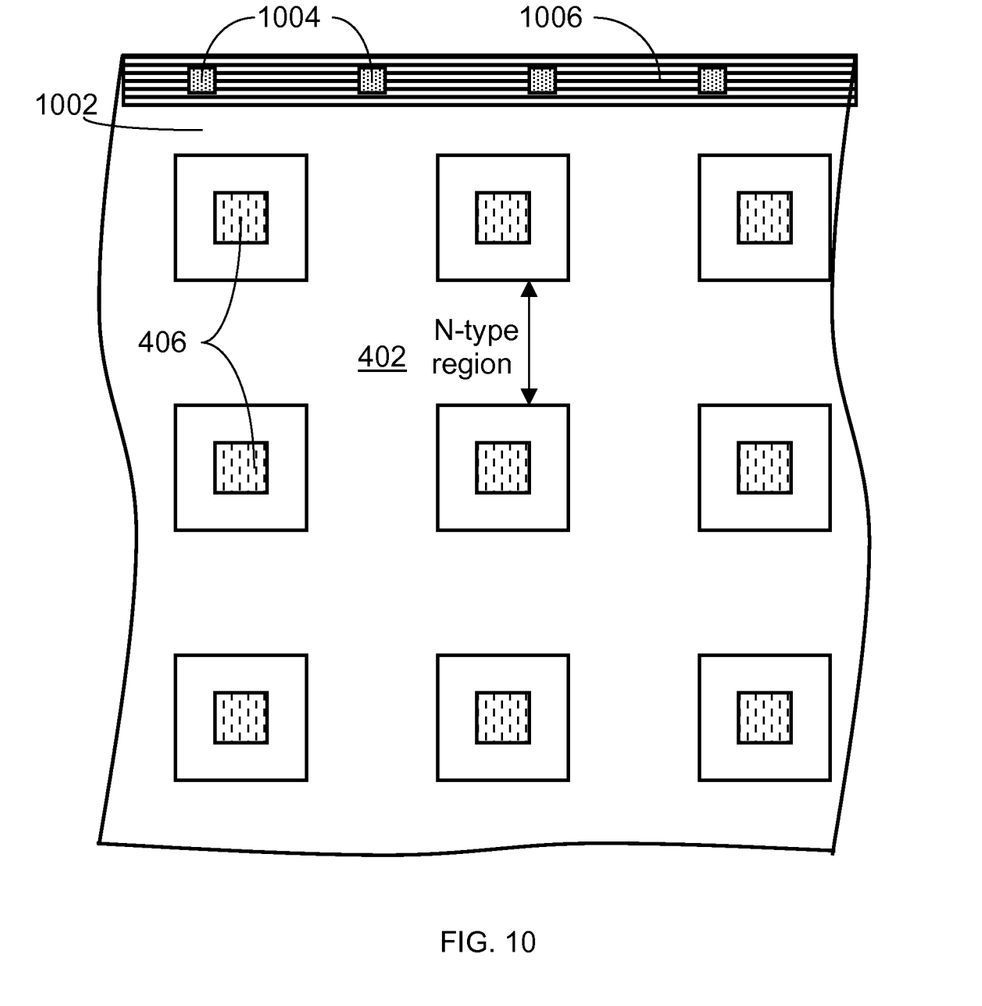
FIG. 10 is a top view of a light sensor according to yet another embodiment of the present invention.

FIG. 10 is yet another example of a top view of an embodiment of the present invention. In FIG. 10, trenches 406 are laid out in isolated blocks while N-type region 402 is laid out as a grid. Contacts 1004 are formed in a common N-type region 1002 and connected to a metal interconnect 1006. The advantage of the light sensor in FIG. 10 is that it provides a larger photodiode junction area than those of FIG. 8 and FIG. 9.

One skilled in the art will recognize that similar top views for the light sensor that has trench gaps filled with polysilicon as described in FIG. 7 can be easily constructed by adding contacts and metal interconnects to the polysilicon in the trench. It should also be noted that the top views presented in FIG. 8, FIG. 9 and FIG. 10 are just a few examples. One skilled in the art will notice there are other ways to construct top views than those described herein.

What is claimed is:

1. A light sensor comprising a plurality of regions of a first conductivity type formed in a semiconductor layer or a substrate of a second conductivity type, said regions of the first conductivity type connected to form a first electrode of a photodiode, said semiconductor layer or a substrate of the second conductivity type forming a second electrode of a photodiode; trenches formed between said regions of the first conductivity type; wherein the spectral sensitivity to infrared is reduced by the carrier recombination at the trench-silicon interface, wherein said trenches are deeper than said regions of the first conductivity type and as deep as 30 μm and wherein the interface trap density is increased for the trench portion in said semiconductor layer of the second conductivity type while the interface trap density is kept low for the trench portion in said regions of the first conductivity type.

2. The method of claim 1 wherein the interface trap density at the trench-silicon interface is increased by surface damages created during such processing steps as plasma etch, ion implantation, deposition of dielectrics and polysilicon and annealing.

3. A light sensor comprising a plurality of regions of a first conductivity type formed in a semiconductor layer or a substrate of a second conductivity type, said regions of the first conductivity type connected to form a first electrode of a photodiode, said semiconductor layer or a substrate of the second conductivity type forming a second electrode of a photodiode; trenches formed between said regions of the first conductivity type; wherein the spectral sensitivity to infrared is reduced by the carrier recombination at the trench-silicon interface, and wherein said regions of the first conductivity type are laid out as narrow and long stripes and separated by stripes of trenches.

4. The light sensor of claim 3 wherein the length of the individual stripe of said regions of the first conductivity type is constant.

5. The light sensor of claim 3 wherein the length of the individual stripe of said regions of the first conductivity type varies.

6. The light sensor of claim 3 wherein said stripes of said regions of the first conductivity types are connected to a common region or regions of the first conductivity type at a side or sides of the photodiode array.

7. A light sensor comprising a plurality of regions of a first conductivity type formed in a semiconductor layer or a substrate of a second conductivity type, said regions of the first conductivity type connected to form a first electrode of a photodiode, said semiconductor layer or a substrate of the second conductivity type forming a second electrode of a photodiode; trenches formed between said regions of the first conductivity type; wherein the spectral sensitivity to infrared is reduced by the carrier recombination at the trench-silicon interface, and wherein each said region of the first conductivity type is an isolated block surrounded by said trenches on four sides.

8. A light sensor comprising a plurality of regions of a first conductivity type formed in a semiconductor layer or a substrate of a second conductivity type, said regions of the first conductivity type connected to form a first electrode of a photodiode, said semiconductor layer or a substrate of the second conductivity type forming a second electrode of a photodiode; trenches formed between said regions of the first conductivity type; wherein the spectral sensitivity to infrared is reduced by the carrier recombination at the trench-silicon interface, and wherein said regions of the first conductivity type are laid out as a grid and isolated blocks of said trenches are placed in areas of said semiconductor layer or substrate of the second conductivity type between said regions of the first conductivity type.

* * * * *